United States Patent
Andreev et al.

(10) Patent No.: US 7,028,274 B1
(45) Date of Patent: Apr. 11, 2006

(54) RRAM BACKEND FLOW

(75) Inventors: Alexander Andreev, San Jose, CA (US); Ranko Scepanovic, Saratoga, CA (US); Ivan Pavisic, San Jose, CA (US); Vojislav Vukovic, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/054,460

(22) Filed: Feb. 9, 2005

(51) Int. Cl.
*G06F 17/50* (2006.01)

(52) U.S. Cl. .................. 716/3; 716/4; 716/10; 716/11; 716/16; 716/17

(58) Field of Classification Search .................. 716/1, 716/3–6, 10–12, 16–18
See application file for complete search history.

(56) References Cited

U.S. PATENT DOCUMENTS 5,825,662 A * 10/1998 Trimberger .................... 716/3
5,838,954 A * 11/1998 Trimberger .................. 716/16
6,732,343 B1 * 5/2004 Frerichs et al. ............... 716/10
2005/0125751 A1 * 6/2005 Miller et al. .................... 716/4
2005/0183054 A1 * 8/2005 Wein et al. .................... 716/11

* cited by examiner

*Primary Examiner*—Paul Dinh
(74) *Attorney, Agent, or Firm*—Luedeka, Neely & Graham, P.C.

(57) ABSTRACT

A method for transforming a customer's memory design into an RRAM memory design. A port mapping table is created that lists the ports of the customer memories, and an instance types table is created that lists the customer memories. For each customer memory that is listed in the instance types table, any virtual buffer nets are removed, and any virtual buffers are removed. Any loose nets so created are reconnected to an RRAM cell in the RRAM memory design. The customer memory instance are then removed. A constraints file is updated from customer memory port designations to RRAM port designations. Automated test logic is inserted into the RRAM memory design, layout on the RRAM memory design is performed, and timing constraints on the RRAM memory design are satisfied. A modified version of the RRAM memory design is returned to the customer for verification. The modified version is made using the port mapping table. Each RRAM matrix is replaced with the customer memories it replaced, the removed virtual buffer nets and virtual buffers are left out, and other parts of the RRAM memory design are left unchanged.

6 Claims, 3 Drawing Sheets

RRAM BACKEND FLOW

FIELD

This invention relates to the field of integrated circuit fabrication. More particularly, this invention relates to moving customer memory configurations into standardized memory blocks.

BACKGROUND

Integrated circuits are often formed using an application specific integrated circuit architecture, which tends to reduce the design costs of the integrated circuit by mixing and matching pre-designed functional blocks in a somewhat customized arrangement to produce an integrated circuit according to a customer's specifications. One functional block of such a customizable integrated circuit design is referred to as Reconfigurable RAM, or RRAM for short.

RRAM contains sets of memories of the same type that are placed compactly within a memory matrix. An RRAM, as the term is used herein, is a mega cell that can be considered as a set of memories with built-in self testing and built-in self correction. RRAM also contains sets of embedded tools that are used for mapping arbitrary logical customer memory designs to the physical memories in the matrix.

What is needed, therefore, is a toolset that enables easier mapping of customer memories to RRAM memories.

SUMMARY

The above and other needs are met by a method for transforming a customer's memory design into an RRAM memory design. A port mapping table is created that lists the ports of the customer memories, and an instance types table is created that lists the customer memories. For each customer memory that is listed in the instance types table, any virtual buffer nets are removed, and any virtual buffers are removed. Any loose nets so created are reconnected to an RRAM cell in the RRAM memory design. The customer memory instance are then removed. A constraints file is updated from customer memory port designations to RRAM port designations. Automated test logic is inserted into the RRAM memory design, layout on the RRAM memory design is performed, and timing constraints on the RRAM memory design are satisfied. A modified version of the RRAM memory design is returned to the customer for verification. The modified version is made using the port mapping table. Each RRAM matrix is replaced with the customer memories it replaced, the removed virtual buffer nets and virtual buffers are left out, and other parts of the RRAM memory design are left unchanged.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
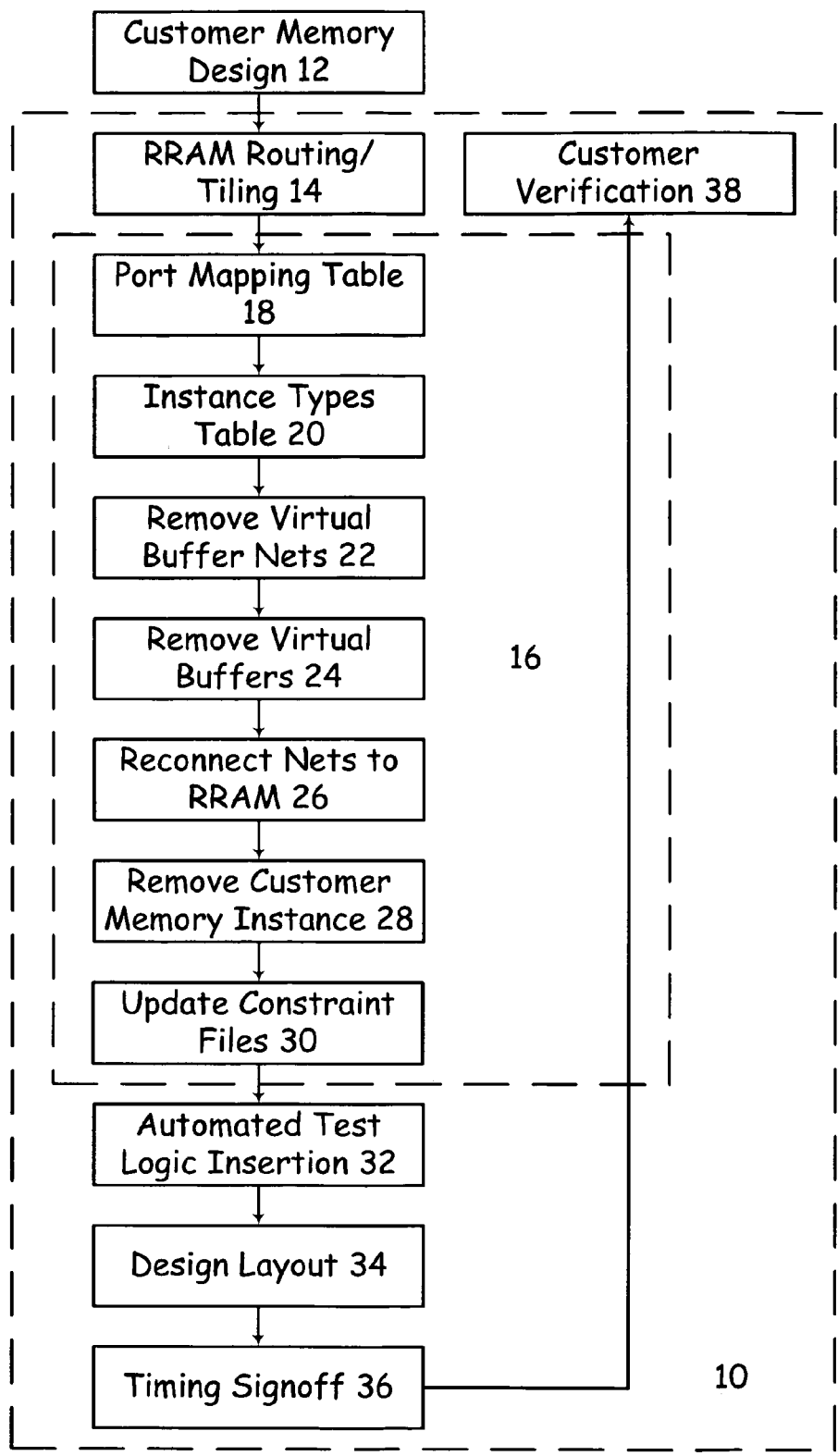
FIG. 1 is a flowchart of a backend memory flow according to a preferred embodiment of the present invention.

The RRAM backend process 10, depicted in FIG. 1, preferably commences with a customer memory design as produced in step 12. Step 12 is generally referred to as the RRAM front end flow, while the other steps described herein are generally referred to as the RRAM back end flow. The customer memory design produced in step 12 preferably includes memory parameters that are specified by the customer, and which meet the customer's requirements for the memory portion of an application specific integrated circuit, or other device. As such, the customer memory design is typically not configured as required for a standardized RRAM cell, and must be transformed in some manner in order to be implemented using the standardized RRAM designs. Each customer memory from the customer design is preferably transferred into an RRAM matrix, as described in more detail below. Depending at least in part upon the size of the customer memories, a given RRAM matrix may contain one or more customer memories. The method as described herein provides a means for accomplishing that transformation from the customer memory to the RRAM.

The customer memory from step 12 is preferably routed and tiled into the RRAM configuration as given in step 14, and the inserted into an RRAM design as generally given in the sequence of steps designated as 16. After the RRAM is inserted, the design is preferably modified through steps 32, 34, and 36, as descried in more detail below. The RRAM backend process 10 preferably also enables a customer to verify the results of his transformed memory design, as given in step 38.

The RRAM matrix preferably retains all of the customer memory interconnections, relationships, and synthesis design constraints. One goal of the backend process 10 is to transform the customer memory to an RRAM while preserving the functionality and constraining requirements of the customer memory. The backend process 10 also preferably places and connects the RRAM master controller 512 and the supporting modules as depicted and described in regard to FIG. 5 hereafter, and produces the memory files (GDF, .lib) needed for automatic standardized testing, generally referred to as FAST herein (flow for automated standardized test).

The backend process 10 preferably provides the customer with an opportunity to verify the customer memory design against the final netlist for the RRAM, as given in step 38. This operation is preferably enabled by returning customer memories back into the transformed design to replace the previously inserted RRAM matrices, along with the modification of the SPEF (standardized parasitic exchange format) statements that refer to the memory, as given in step 16. Thus, step 16 in one direction transforms the customer memory with RRAM designs, and in another direction replaces the RRAM designs with the customer memories, so that the customer can verify that the transformation has not altered important structural relationships of the desired memories.

Insertion of the Matrices

Figure 2:
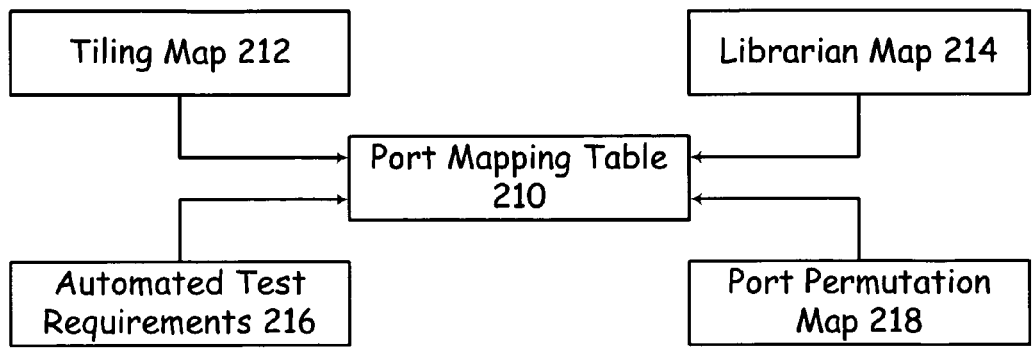
FIG. 2 is a flowchart of memory insertion input sources according to a preferred embodiment of the present invention.

The insertion of the matrices as given in step 16 is preferably accomplished by first creating a port mapping table 210, depicted in FIG. 2, between the RRAM matrices and the customer memories, as given in step 18. In other words, the port mapping table 210 contains mapping between ports of customer memories and RRAM ports. An instance types table is also created, as given in step 20. These two tables are preferably used to insert the matrices into an RRAM design.

Figure 3:
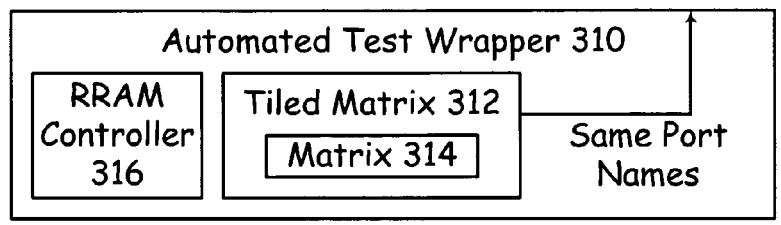
FIG. 3 is a functional block diagram of a wrapper architecture according to a preferred embodiment of the present invention.

The port mapping table 210 is preferably constructed using information from several sources, which information is generally referred to herein as a map. The tiling step 14 preferably produces a tiling map 212. The customer preferably produces a librarian map 214 in step 12. The memory mapping process preferably produces a port permutation map 218. Finally, data from the FAST wrapping process 310 is preferably used to assign tiled matrix names to wrapper module names, since the port names are preferably propagated unchanged to the top level, as depicted in FIG. 3.

Figure 4:
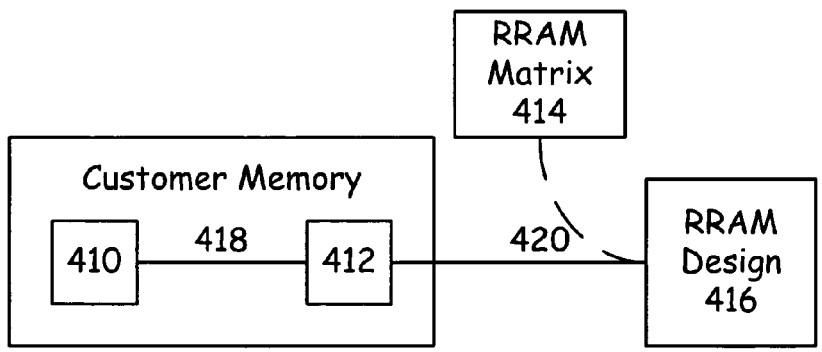
FIG. 4 is a representation of the removal of virtual buffers and A nets according to a preferred embodiment of the present invention.

The next process steps preferably produce an engineering change order (ECO) file that contains the changes desired to transform the customer design into the RRAM. Using the information in the port mapping table 210 and the instance types table produced in step 20, all the matrices are preferably inserted into an RRAM design, and then each customer memory instance 410 that should be mapped into a matrix is looked up, as depicted in FIG. 4. When the customer memory 410 is found, preferably all its ports are sequentially processed in three steps. First, any net 418 that is internally connected to a virtual buffer 412 is removed, as given in step 22. Next, the virtual buffer 412 itself is removed, as given in step 24. Finally, the net 420 is reconnected to the corresponding port of an RRAM matrix 414, as given in step 26, using information that is preferably obtained from the port mapping table 210. After all the ports have been processed in this manner, the memory instance 410 is preferably removed from the growing design 416, as given in step 28, and a new memory instance is processed. This process preferably repeats until all memory instances 410 have been processed.

Since the building memory blocks of RRAM matrices are preferably type 222, when a customer memory is a type 111, the backend process 10 preferably ties every unused matrix port to the designated value, meaning that the inputs are tied to ground, and the outputs are left floating. The design flow tools then preferably use the generated ECO file to modify the original design netlist. Type 222 means a two port memory where both ports are read-write, and type 111 means a one port memory with read-write capability.

Synthesis Design Constraint Modification

Because all the constraints in the customer memory design typically name the objects from the customer's perspective, it is desirable to also incorporate the design changes from the steps above into the constraint files, as given in step 30. This process is preferably done in two steps. In the first step, synthesis design constraint "get_" statements are processed, and in the second step their results are used to form the final statement. The RRAM transformation preferably causes a cell from the original design to be transformed into a set of ports of a matrix, thus imposing a bigger change for a constraint that refers to memory instances. The biggest port replacement list tends to be for "get_lib_cells," but the "set_disable_timing" statement preferably receives special processing, because of all the possible cases in the FROM/TO/THROUGH port flagging.

Other Backend Flow Tasks

Besides inserting RRAM matrices into the design, one additional function of the backend process 10 is preferably to take care of all the additional modules that are desirable for the memory to function properly.

Figure 5:
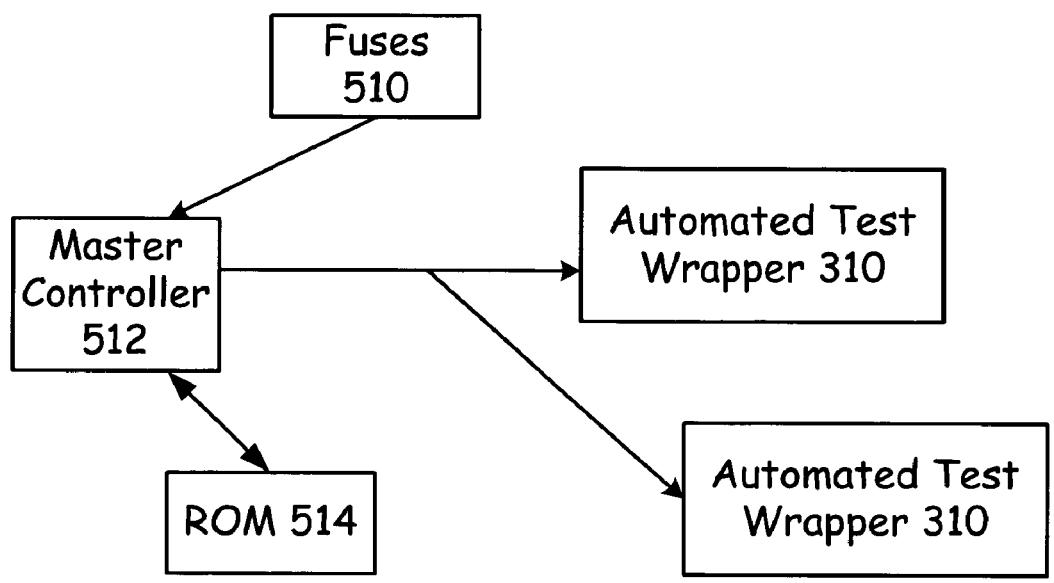
FIG. 5 is a functional block diagram of the master controller connections according to a preferred embodiment of the present invention.

The backend process 10 preferably first reads in the connections between matrices (actually FAST wrappers 310), the master controller 512, and several other modules, such as the ROM module 514 and the built in self repair fuses 510, from the internally generated table, as depicted in FIG. 5. The process preferably inserts all of them in the RRAM design with the RRAM matrices, and creates an ECO file with the connections. The process preferably fulfills the FAST requirements by inserting the nets whose names are expected for the test logic insertion process, as given in step 32, and by generating data files for every hard macro created in the memory flow.

The process 10 preferably next reads the placement coordinates and places matrices with controllers and the master controller at the assigned locations, as given in step 34. The backend process 10 is preferably in charge of any other file that might be needed after the previously described steps are completed. A timing verification is preferably performed as given in step 36, to ensure that the transformed memory is within the timing design tolerances.

RRAM Removal

The process 10 described herein preferably allows customers to verify that the features of a design that they created are preserved after the RRAM is inserted and the final design netlist is formed. The operations described above in the memory insertion process 16 can be conducted in a modified reverse order, to enable the verification by the customer. The starting netlist to be modified in this reverse process is preferably the final netlist produced above. The first step in this backward direction is preferably to return the replaced customer memories back into the design. That task is preferably accomplished using the same mapping tables from the memory insertion process described above. The difference is that the removed virtual buffers 412 and nets 418 are preferably not put back, because they don't have a purpose any more, and are used just to keep matrix port positions for the insertion. In order to do a minimal set of changes and still allow customers to verify their design in a desirable way, the output ports of the matrices are preferably just disconnected from their nets 420. All the other parts of the inserted logic are preferably left unchanged.

The SPEF file generated after the routing is preferably also modified such that all the references to the RRAM matrices are replaced with the customer references in accordance to the mapping table 210. The customer can then review the design as given in block 38, to ensure that the transformed memory design does not functionally vary from the original customer memory design. Any discrepancies can be reported and resolved, and another verification can be done by the customer. When all discrepancies are resolved, the transformed RRAM memory is released for inclusion into the integrated circuits ordered by the customer.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for transforming a customer's customer memory design having customer memories into an RRAM memory design having RRAM cells in an RRAM matrix, the method comprising the steps of:
   create a port mapping table that lists the ports of the customer memories,
   create an instance types table that lists the customer memories,
   for each customer memory listed in the instance types table,
      remove any virtual buffer nets,
      remove any virtual buffers,
      reconnect any loose nets so created to an RRAM cell in the RRAM memory design, and
      remove the customer memory instance,
   update a constraints file from customer memory port designations to RRAM port designations,
   insert automated test logic into the RRAM memory design,
   perform layout on the RRAM memory design, and
   satisfy timing constraints on the RRAM memory design.

2. The method of claim 1, further comprising the step of returning a modified version of the RRAM memory design to the customer for verification.

3. The method of claim 2, wherein the step of returning a modified version of the RRAM memory design comprises:
   using the port mapping table, replace each RRAM matrix with a set of customer memories it replaced,
   leave out the removed virtual buffer nets and virtual buffers, and
   leave other parts of the RRAM memory design unchanged.

4. A method for transforming a customer's customer memory design having customer memories into an RRAM memory design having RRAM cells in an RRAM matrix, the method comprising the steps of:
   create a port mapping table that lists the ports of the customer memories,
   create an instance types table that lists the customer memories,
   for each customer memory listed in the instance types table,
      remove any virtual buffer nets,
      remove any virtual buffers,
      reconnect any loose nets so created to an RRAM cell in the RRAM memory design, and
      remove the customer memory instance,
   update a constraints file from customer memory port designations to RRAM port designations,
   insert automated test logic into the RRAM memory design,
   perform layout on the RRAM memory design,
   satisfy timing constraints on the RRAM memory design, and
   return a modified version of the RRAM memory design to the customer for verification.

5. The method of claim 4, wherein the step of returning a modified version of the RRAM memory design comprises:
   using the port mapping table, replace each RRAM matrix with a set of customer memories it replaced,
   leave out the removed virtual buffer nets and virtual buffers, and
   leave other parts of the RRAM memory design unchanged.

6. A method for transforming a customer's customer memory design having customer memories into an RRAM memory design having RRAM cells in an RRAM matrix, the method comprising the steps of:
   create a port mapping table that lists the ports of the customer memories,
   create an instance types table that lists the customer memories,
   for each customer memory listed in the instance types table,
      remove any virtual buffer nets,
      remove any virtual buffers,
      reconnect any loose nets so created to an RRAM cell in the RRAM memory design, and
      remove the customer memory instance,
   update a constraints file from customer memory port designations to RRAM port designations,
   insert automated test logic into the RRAM memory design,
   perform layout on the RRAM memory design,
   satisfy timing constraints on the RRAM memory design, and
   return a modified version of the RRAM memory design to the customer for verification, by,
      using the port mapping table, replace each RRAM matrix with a set of customer memories it replaced,
      leave out the removed virtual buffer nets and virtual buffers, and
      leave other parts of the RRAM memory design unchanged.

* * * * *